(12) United States Patent
Hougham et al.

(10) Patent No.: US 7,402,053 B2
(45) Date of Patent: *Jul. 22, 2008

(54) PIN GRID ARRAY ZERO INSERTION FORCE CONNECTORS CONFIGURABLE FOR SUPPORTING LARGE PIN COUNTS

(75) Inventors: Gareth Geoffrey Hougham, Ossining, NY (US); William Louis Brodsky, Binghamton, NY (US); Thomas M. Cipolla, Katonah, NY (US); Paul William Coteus, Yorktown Heights, NY (US); Ronald Malfatt, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/763,499

(22) Filed: Jun. 15, 2007

(65) Prior Publication Data
US 2008/0026628 A1   Jan. 31, 2008

Related U.S. Application Data

(63) Continuation of application No. 11/496,153, filed on Jul. 31, 2006, now Pat. No. 7,322,844.

(51) Int. Cl.
*H01R 12/00* (2006.01)

(52) U.S. Cl. ......................................... 439/70; 439/342

(58) Field of Classification Search .................. 439/342, 439/343, 117
See application file for complete search history.

(56) References Cited

U.S. PATENT DOCUMENTS

| 4,341,429 | A  | * | 7/1982 | Bright et al. ................. 439/268 |
| 6,062,084 | A  | * | 5/2000 | Chang et al. .................. 73/601 |
| 6,679,707 | B1 | * | 1/2004 | Brodsky et al. ............... 439/71 |
| 7,322,844 | B1 | * | 1/2008 | Hougham et al. ........... 439/342 |
| 2003/0114035 | A1 | * | 6/2003 | Tran ........................... 439/342 |
| 2005/0151203 | A1 | * | 7/2005 | Cho et al. .................... 257/371 |

* cited by examiner

*Primary Examiner*—Tho D. Ta
*Assistant Examiner*—Travis Chambers
(74) *Attorney, Agent, or Firm*—Daniel P. Morris; Ryan, Mason & Lewis, LLP (57) ABSTRACT

A PGA socket including a plurality of sub-socket components, which when used in combination forms a larger effective socket, includes multiple apertures configured to receive corresponding pins of an IC. The PGA socket further includes multiple contact members, each of the contact members corresponding to a respective one of the apertures. The contact members are configured to movably engage corresponding pins of the IC upon respective movement of the apertures so as to provide electrical and mechanical contact thereto. Each of the sub-socket components is configured to mechanically engage at least one of the other sub-socket components such that the contact members in each of the sub-socket components are capable of electrically connecting to corresponding pins of the IC substantially simultaneously.

18 Claims, 11 Drawing Sheets

PIN GRID ARRAY ZERO INSERTION FORCE CONNECTORS CONFIGURABLE FOR SUPPORTING LARGE PIN COUNTS

CROSS REFERENCE TO RELATED APPLICATION

This application is a continuation of U.S. application Ser. No. 11/496,153 filed on Jul. 31, 2006, which issued as U.S. Pat. No. 7,322,844 on Jan. 29, 2008, the disclosure of which is incorporated by reference herein.

FIELD OF THE INVENTION

The present invention relates generally to area array microelectronic interconnections, and more particularly relates to pin grid array type area interconnections.

BACKGROUND OF THE INVENTION

Pin grid arrays (PGAs) are commonly used in the microelectronics industry, for example, for connecting a chip module to a printed circuit board or printed wiring board, utilizing pins in an area under the module that plug into a corresponding socket on the printed circuit board. Alternatively, the module may utilize a socket in an area under the module which is adapted for receiving corresponding pins mounted on the printed circuit board. PGAs are commonly, although not always, referred to as zero insertion force (ZIF) connectors. The term "ZIF connector" generally refers to a socket arrangement wherein when the socket is open, a chip may be placed in the socket without any pressure at all, and when the socket is then closed, the contacts of the socket grip the pins of the chip. Micro-PGA sockets typically refer to a PGA socket configured having a pin spacing, also referred to as pin pitch or simply pitch, between adjacent pins that is about 1.27 millimeters (mm) or less.

Micro-PGAs are often preferred to other types of area array sockets, such as, for example, land grid arrays (LGAs), primarily because assembly and disassembly are much easier and do not require actuating hardware with posts that extend through the printed circuit board. PGA sockets are often soldered to the printed circuit board in a surface mounted fashion. The module typically has pins extending downward. In a ZIF arrangement, the module and socket on the PCB are typically brought together such that the pins are inserted all at once into corresponding contact holes in the PGA socket, and then the socket contacts are brought into electrical and physical contact with the pins using a mechanism that moves a top plane of the socket laterally, thereby engaging each pin to the respective electrical connection at that grid location.

Most high input/output (I/O) count chip modules (e.g., greater than about 100 pins) currently use a 1.00 mm pitch to interconnect to the printed circuit board, either by soldering, as ball grid arrays (BGAs), or by socketing with LGAs. PGAs, in contrast, are most commonly used on smaller I/O modules and often at a 1.27 mm pitch, PGA suppliers are now attempting to fabricate PGA sockets that have a large I/O count at a 1.00 mm pitch, but are struggling to achieve a 50 mm×50 mm array size. Conventional interconnection methodologies appear to be approaching a natural limit based at least in part on characteristics of the injection molding process typically used to fabricate the plastic component parts. For example, injection molding parts with sufficient uniformity and flatness is difficult, in part because the large area of a 50 mm×50 mm array makes the transport of molten plastic from the injection ports to all mold areas difficult and in part from shrinkage and thermally induced stress across the array. This precludes making PGAs as a single molded piece for large substrates such as those currently serviced by LGAs with I/O pin counts greater than about 7000.

Accordingly, there exists a need for an improved PGA-type microelectronic interconnection capable of providing substantially large I/O pin counts (e.g., greater than about 7000) that does not suffer from one or more of the problems exhibited by conventional PGA-type area interconnections.

SUMMARY OF THE INVENTION

The present invention, in illustrative embodiments thereof, meets the above-noted need by providing a PGA-type socket which overcomes certain characteristic limitations associated with conventional PGA interconnections. The illustrative PGA socket has a finer pitch compared to standard PGA sockets, thereby allowing the PGA socket to receive integrated circuits (ICs) having larger I/O pin counts than what would have otherwise been achievable using conventional means. To accomplish this, in accordance with illustrative embodiments of the invention, two or more sub-socket components having a finer pitch (e.g., less than about 1.27 mm) are beneficially combined to form a larger effective ZIF PGA socket adapted to provide an electrical interconnection with large I/O pin count ICs. Each of the sub-socket components is configured to mechanically engage at least one of the other sub-socket components so that electrical connection between individual pins of an IC received by the socket and corresponding contacts of the socket are made at substantially the same time.

In accordance with one aspect of the invention, a PGA socket comprising a plurality of sub-socket components, which when used in combination forms a larger effective socket, includes multiple apertures configured to receive corresponding pins of an IC. The PGA socket further includes multiple contact members, each of the contact members corresponding to a respective one of the apertures. The contact members are configured to movably engage corresponding pins of the IC upon respective movement of the apertures so as to provide electrical and mechanical contact thereto. Each of the sub-socket components is configured to mechanically engage at least one of the other sub-socket components such that the contact members in each of the sub-socket components are capable of electrically connecting to corresponding pins of the IC substantially simultaneously.

These and other features, advantages and objects of the present invention will become apparent from the following detailed description of illustrative embodiments thereof, which is to be read in connection with the accompanying drawings.

DETAILED DESCRIPTION OF THE INVENTION

The present invention will be described herein in the context of illustrative embodiments of a ZIF PGA socket. It should be understood, however, that the present invention is not limited to the particular PGA socket arrangements shown. Rather, the present invention provides techniques for advantageously overcoming certain characteristic limitations of conventional PGA interconnections. The illustrative ZIF PGA socket has a finer pitch compared to standard PGA sockets, thereby allowing the PGA socket to receive ICs having larger I/O pin counts than what would have otherwise been achievable using conventional methodologies. The PGA socket formed in accordance with embodiments of the present invention is particularly well-suited for use in a wide variety of IC applications, such as, for example, applications involving the interconnection of high pin count ICs with a printed wiring board.

Small pitch PGA sockets (e.g., about 1.27 mm or less) are sometimes referred to as micro-PGA sockets. The limitation is that such fine pitch PGA sockets become more difficult to manufacture, particularly using injection molding techniques, due primarily to the required uniformity and flatness across the socket and to the thin walls between contact apertures that are necessitated by the fine pitch. The size limit that can be reached for a standard PGA socket is much smaller than current array sizes. For example, the largest 1.0 mm pitch PGA socket currently available measures about 50 mm×50 m. And this size is only available on a beta test basis due to manufacturing flaws that have not yet been eliminated. It is commonly understood that this 50 mm×50 mm size is nearing an intrinsic maximum size that a PGA socket can be made at such finer pitch. Since this size is barely one quarter the size of other available socket types, notably land grid arrays (LGAs), PGA sockets are losing market share and technological value.

In accordance with aspects of the present invention, at least two smaller sub-socket components having a finer pitch (e.g., less than about 1.27 mm) are preferably combined to form a larger effective PGA socket adapted to provide an electrical interconnection with large I/O pin count ICs. Each of the sub-socket components is configured to mechanically engage at least one of the other sub-socket components in the PGA socket so that electrical connection between individual pins of an IC received by the socket and corresponding contacts of the socket are made at substantially the same time.

In the case of a PGA socket comprised of four smaller sub-socket components, it is not enough to simply use four smaller pitch PGA sockets, one in each quadrant of the PGA socket, for at least two principal reasons. First, a ZIF mechanism typically imposes a lateral force on the pins of an IC placed into the PGA socket and on the PGA socket itself, which is pulled along with the IC pins relative to a printed wiring board (e.g., printed circuit board (PCB)). Consequently, placing four standard ZIF PGA sub-socket components in the four corresponding quadrants of the larger PGA socket would result in forcing the pins of the IC in at least two different directions. Two ZIF PGA sub-socket components would tend to force the IC pins toward an outside edge, moving the module along with it, while the other two ZIF PGA sub-socket components on the other side of the PGA socket module would force the IC pins in the opposite direction. This would result in the pins of the IC getting bent or sheared off. Second, since the ZIF mechanism in each of the four PGA sub-socket components would not be engaged simultaneously (e.g., engaging as close to simultaneously as possible), the IC module placed into the PGA socket would move and twist and the IC pins would undesirably bend or shear.

Figure 1:
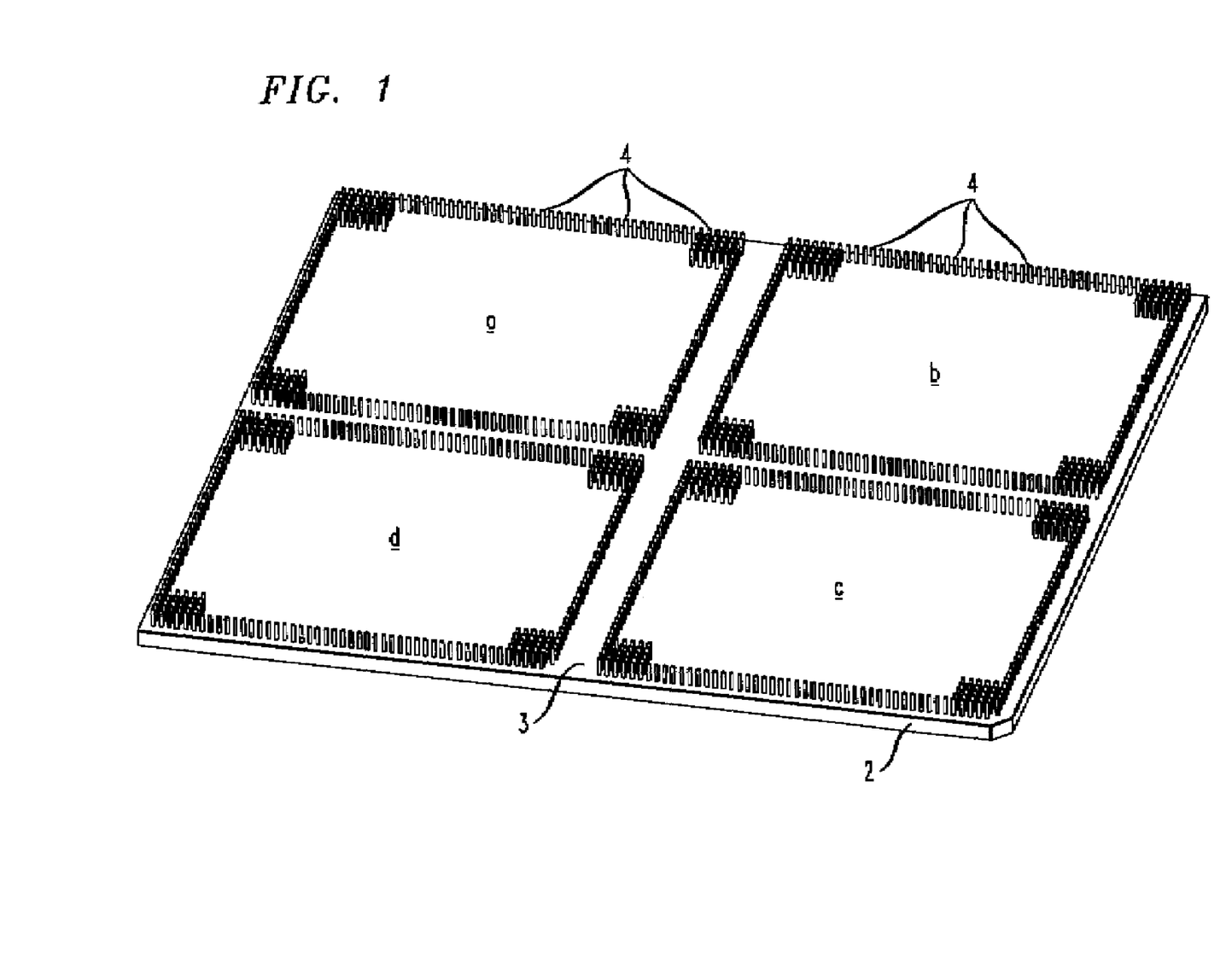
FIG. 1 is a perspective view showing the underside of an illustrative IC module with pins arranged in four quadrants across an area of the module.

FIG. 1 is a perspective view showing the underside of an illustrative IC module 2 having a plurality of pins 4 extending substantially orthogonal to (e.g., vertically from) a bottom surface 3 of the IC module and being arranged in four quadrants, a, b, c and d, across an area of the module. In order to simplify the drawing, only a subset of the actual number of IC pins are shown. It is to be understood that the invention is not limited to any particular dimensions for the IC module, nor is the invention limited to use with an IC module having a particular number of pins.

Figure 2:
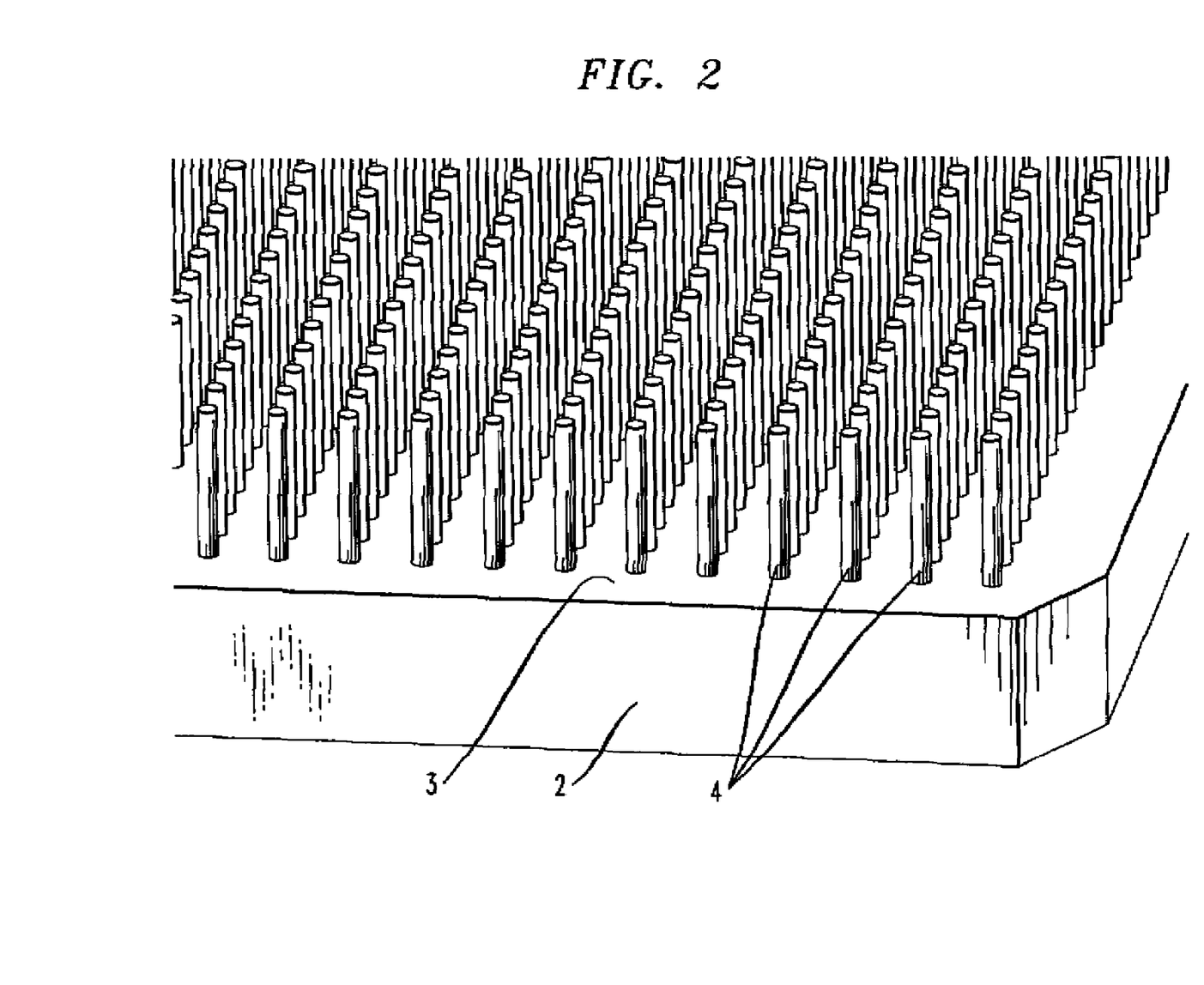
FIG. 2 is a perspective view illustrating an enlargement of the underside of the IC module shown in FIG. 1 depicting pins extending vertically from the underside of the IC module.

FIG. 2 is a perspective view illustrating an enlargement of at least a portion of the underside of IC module 2 shown in FIG. 1 depicting pins 4 extending substantially vertically from the bottom surface 3 of the IC module.

Figure 3:
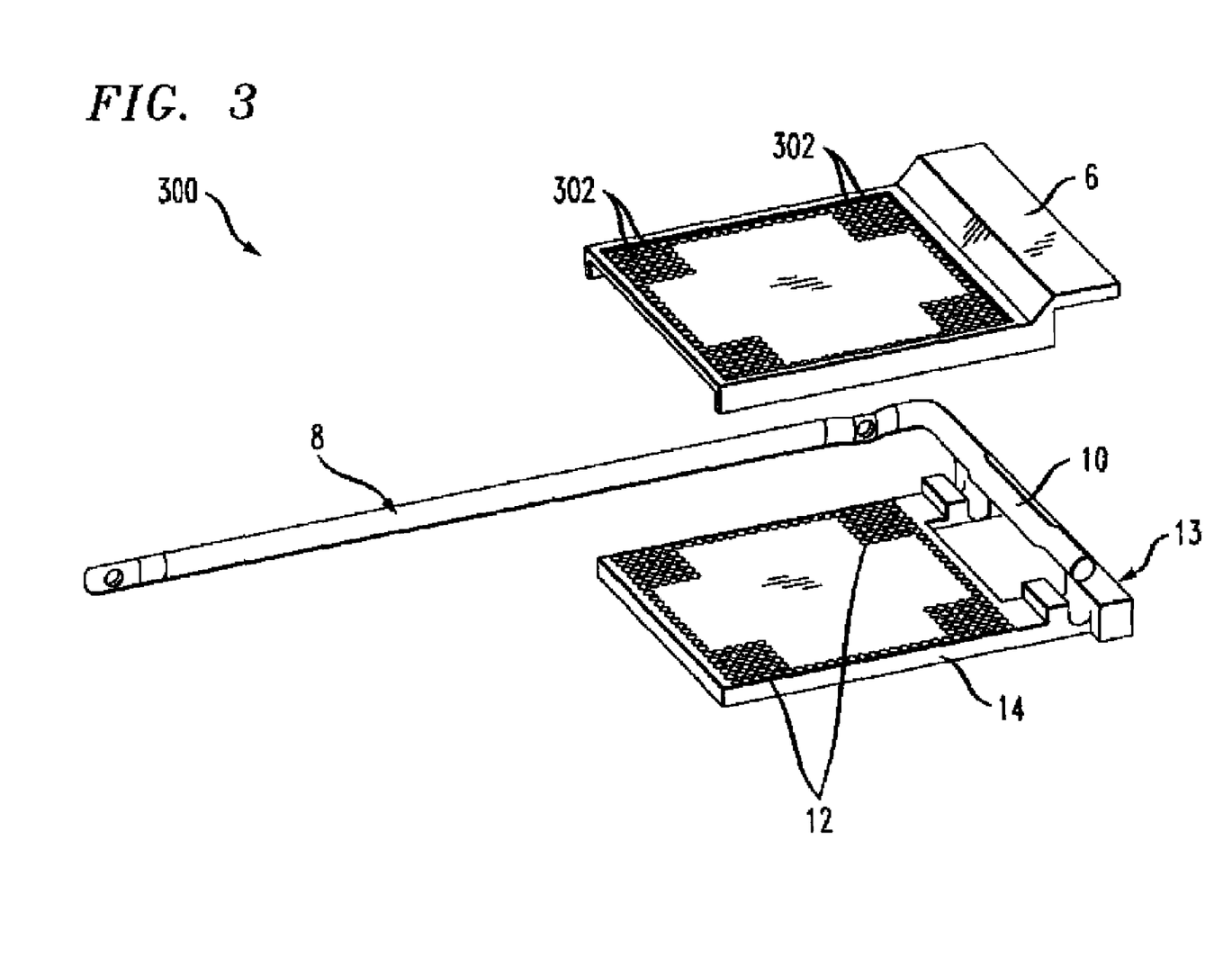
FIG. 3 is an exploded view depicting an illustrative ZIF PGA socket which can be modified for use with the present invention.

FIG. 3 is an exploded perspective view depicting portions of an illustrative ZIF PGA socket 300. The illustrative PGA socket 300 includes a top portion 6 which includes a plurality of openings or apertures 302 therein adapted to receive corresponding pins of an IC module (not shown), for example, an IC module as depicted in FIG. 1, which is placed into the socket. The PGA socket 300 further includes a bottom portion or base 14 comprising a plurality of contact members 12, each of the contact members corresponding to a respective one of the apertures 302 in the top portion 6. The top portion 6 is adapted to move laterally with respect to the base 14, which is preferably stationary, and to guide the pins of the IC module into electrical and physical contact with the electrically conducting contact members 12 in the base. Although not shown, the contact members 12 typically configured so as to extend through the base 14 so as to provide a means of external electrical connection between the PGA socket 300 and a printed wiring board to which the socket may be mounted.

The base 14 also houses a mechanical lever 8 that is adapted to activate a cam mechanism 10 which moves the top portion 6 of the PGA socket 300 laterally relative to the base, away from an outside edge 13 of the socket 300 as the lever is moved downward (e.g., toward the base). The movement of the top portion 6, in turn, guides the pins of the IC module into electrical contact with corresponding contact members 12 in the base 14. For clarity purposes, only a portion of the apertures 302 and corresponding contact members 12 are shown, although the invention is not limited to any specific number of apertures and/or contact members.

Figure 4:
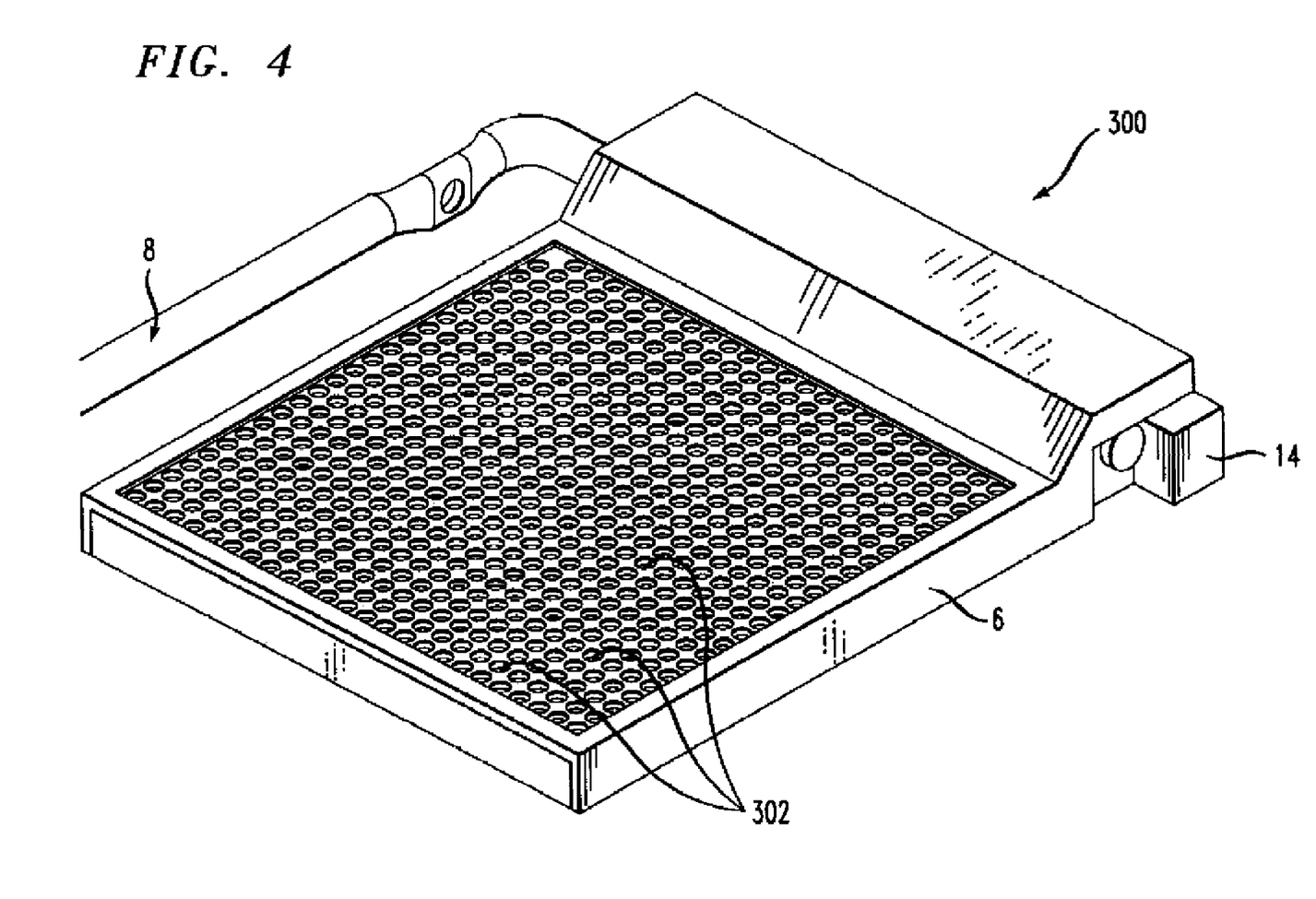
FIG. 4 is a perspective view depicting the illustrative PGA socket shown in FIG. 3 as assembled.

FIG. 4 illustrates a perspective view of the assembled exemplary PGA socket 300 shown in FIG. 3, including the top portion 6, base 14, and lever 8. Also shown is the plurality of apertures 302 in the top portion 6.

Figure 5:
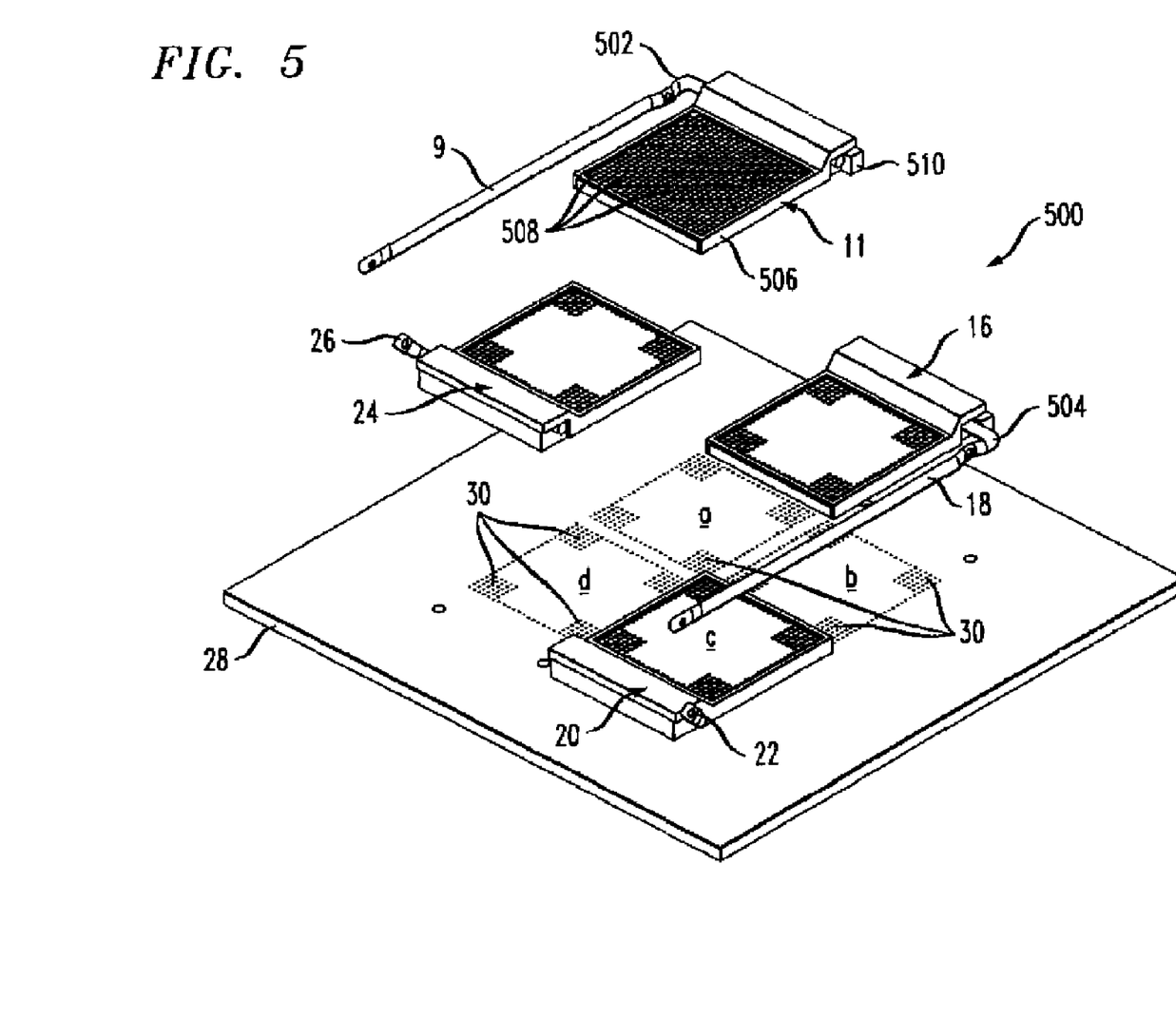
FIG. 5 is a perspective view depicting an exemplary ZIF PGA socket, formed in accordance with an embodiment of the present invention.

With reference now to FIG. 5, there is shown a perspective view depicting an exemplary ZIF PGA socket 500, formed in accordance with one embodiment of the present invention. The PGA socket 500 comprises a plurality of PGA sub-socket components, namely, a first sub-socket component 11, a second sub-socket component 16, a third sub-socket component 20, and a fourth sub-socket component 24. The sub-socket components 11, 16, 20, 24 are preferably formed in a manner similar to the illustrative ZIF PGA socket 300 shown in FIG. 3, except for the cam mechanism and lever configuration, as will be explained in further detail below. Specifically, each of the PGA sub-socket components, of which sub-socket component 11 is representative, preferably comprises a top portion 506 which includes a plurality of apertures 508 therein adapted to receive corresponding pins of an IC module (not shown) which is placed into the sub-socket component. Sub-socket component 11 further includes a bottom portion or base 510 comprising a plurality of electrically conducting contact members, each contact member corresponding to a respective one of the apertures 508 in the top portion 506. The top portion 506 is adapted to move laterally (e.g., horizontally, in a plane substantially parallel to an upper surface of the base 510) with respect to the base 510, which may be stationary, and to guide the pins of the IC module into electrical and mechanical contact with the contact members in the base. For clarity purposes, only a portion of the apertures 508 are shown, although the invention is not limited to any specific number of apertures and/or contact members.

Each of the sub-socket components 11, 16, 20, 24 is preferably disposed on a printed wiring board 28, or alternative substrate, so as to form a corresponding quadrant of the larger ZIF PGA socket 500. For example, first sub-socket component 11 forms quadrant a of PGA socket 500, second sub-socket component 16 forms quadrant b of the PGA socket, third sub-socket component 20 forms quadrant c of the PGA socket, and fourth sub-socket component 24 forms quadrant d of the PGA socket. The printed wiring board 28 includes an array of pad sites 30 to which respective contact members in each of the sub-socket components 11, 16, 20, 24 will be electrically connected, such as, for example, by soldering or other attachment means. It is to be appreciated that the invention is not limited to the particular number of sub-socket components forming the ZIF PGA socket 500.

As apparent from the figure, each of the sub-socket components 11, 16, 20 and 24 preferably includes its own mechanical lever 502, 504, 22 and 26, respectively, that is adapted to activate a cam mechanism in the sub-socket component which moves the top portion (e.g., 506) of the sub-socket component so as to electrically and mechanically engage contact members in the base (e.g., 510) of the sub-socket component with corresponding pins of an IC module received by the sub-socket component, as previously explained. The sub-socket components are preferably configured such that movement of all respective contact members is performed in a same plane (e.g., laterally) and in a same direction relative to one another.

To accomplish this, first sub-socket component 11 includes a modified lever arm 9 which activates lever 502. First sub-socket component 11 is combined with second sub-socket component 16 having a lever arm 18 which activates lever 504 on an opposite side of the sub-socket component. First and second sub-socket components 11 and 16, respectively, are combined with third sub-socket component 20 which is preferably oriented in an opposite direction relative to the first and second sub-socket components. Third sub-socket component 20, when activated by lever 22, will move a top portion thereof in an opposite direction relative to its base during pin engagement so that the top portion of the third sub-socket component moves in the same absolute direction relative to first and second sub-socket components 11, 16. Similarly, fourth sub-socket component 24, when activated by lever 26, will move the pins of the received IC in a direction opposite that of first and second sub-socket components 11, 16 relative to itself (e.g., by virtue of a different configuration of the internal cam mechanism), but in absolute terms will move a top portion of the fourth sub-socket component in substantially the same direction as top portions of the other three sub-socket components.

Accordingly, the four sub-socket components 11, 16, 20, 24 are combined to form one larger ZIF PGA socket 500 which, upon actuation by a common lever system comprised of all four levers 502, 504, 22 and 26, and both lever arms 9 and 18 connected to each other, will move top portions of all four sub-socket components in the same direction and plane at substantially the same time. Lever systems other than the four-arm linkage arrangement shown are similarly contemplated by the present invention, including, but not limited to, cable systems, gear systems, etc.

Figure 6:
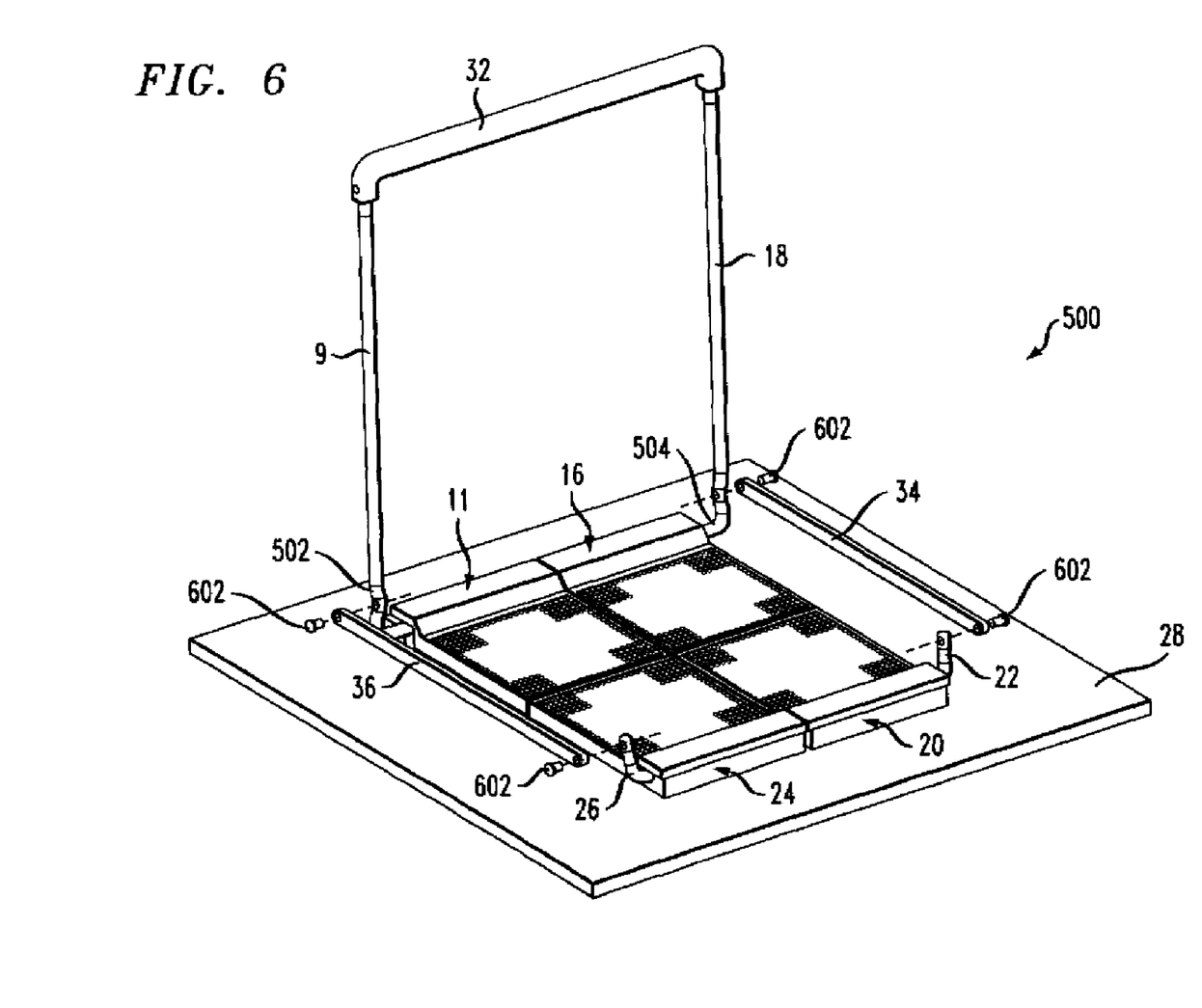
FIG. 6 is an exploded perspective view depicting the exemplary ZIF PGA socket of FIG. 5 shown at a more advanced stage of assembly, in accordance with an embodiment of the invention.

FIG. 6 is an exploded perspective view depicting the exemplary ZIF PGA socket 500 of FIG. 5 shown at a more advanced stage of assembly, in accordance with an embodiment of the invention. As apparent from the figure, the four sub-sockets components 11, 16, 20 and 24 have been soldered to printed wiring board 28 to form PGA socket 500. Each of the levers associated with the four sub-socket components are preferably mechanically connected to form a common lever system. Specifically, lever 504 of second sub-socket component 16 is connected to lever 22 of third sub-socket component 20 by way of a linkage arm 34, or alternative connection means. Likewise, lever 502 of first sub-socket component 11 is connected to lever 26 of fourth sub-socket component 24 by way of linkage arm 36. The linkage arms 34, 36 are preferably joined to their respective levers by fasteners 602 which allow the levers and corresponding linkage arms to pivotally engage with one another. Lever arm 9, which controls activation of corresponding levers 502 and 26, and lever arm 18, which controls activation of corresponding levers 504 and 22, are preferably connected together by a primary lever arm 32. In this manner, activation of the primary lever arm 32 will essentially simultaneously activate all four levers 502, 504, 22 and 26.

Figure 7:
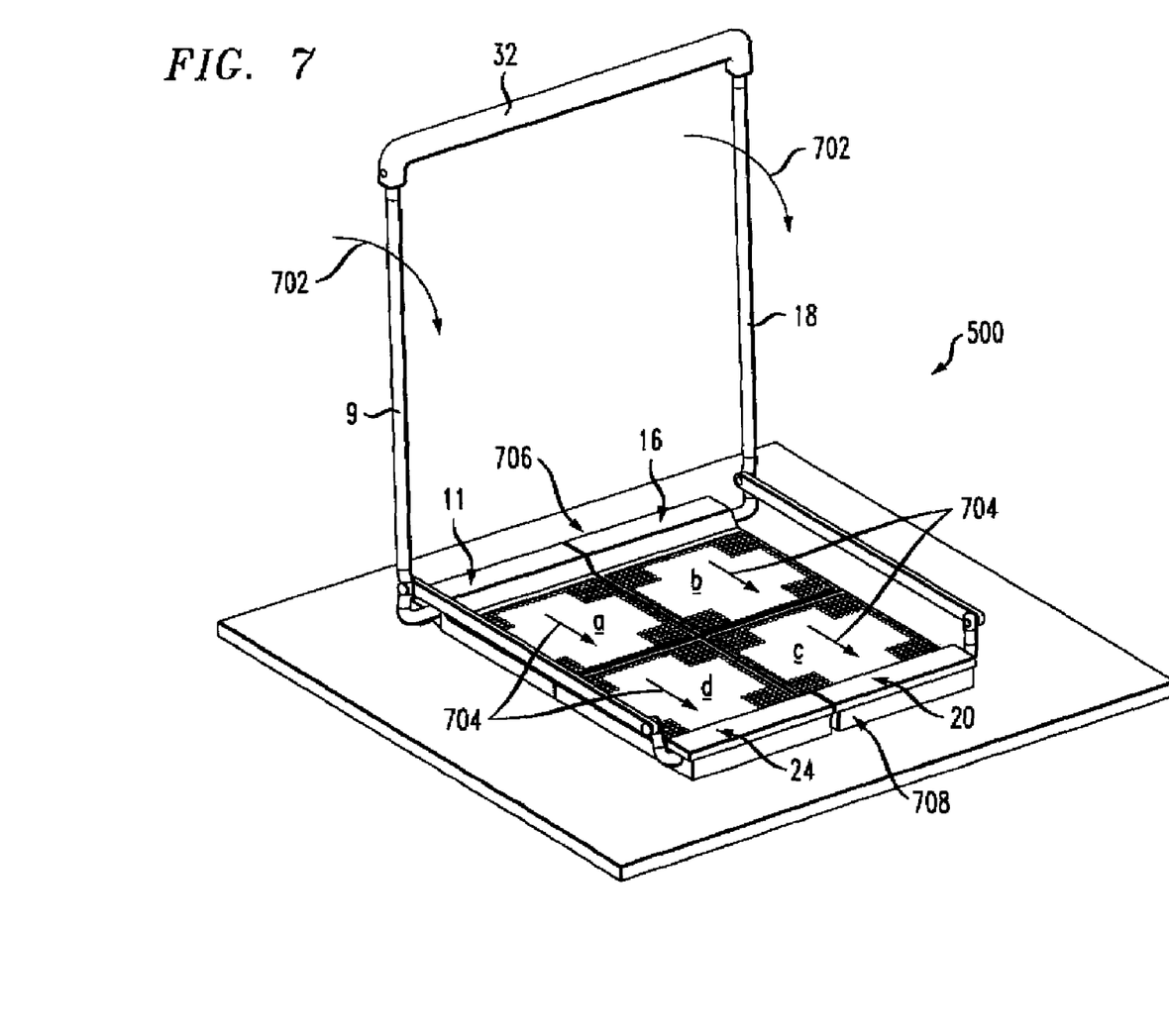
FIG. 7 is a perspective view of the exemplary ZIF PGA socket of FIG. 5 fully assembled and soldered onto a printed wiring board, in accordance with an embodiment of the invention.

FIG. 7 is a perspective view of the exemplary ZIF PGA socket 500 fully assembled and soldered onto a printed wiring board, in accordance with an embodiment of the invention. The PGA socket 500 is shown in an "open" position, wherein contact members in each of the sub-socket components 11, 16, 20 and 24 are disengaged and ready to receive a pinned IC module. Each of the sub-socket components 11, 16, 20, 24 are configured such that, upon activation of lever arms 9 and 18 in the direction indicated by arrows 702, top portions of the sub-socket components in all four quadrants a, b, c and d will move in the same plane and direction as indicated by arrows 704. Specifically, the top portions of first and second sub-socket components 11 and 16 will move away from outside edge 706 and top portions of third and fourth sub-socket components 20 and 24 will move toward outside edge 708 upon activation of lever arms 9 and 18 in the direction indicated by arrows 702. Such movement of the sub-socket components requires at least two different internal cam mechanisms. Arrows 704 indicate a common direction of movement of the top portions of each PGA sub-socket component relative to their respective bases which remain stationary.

Thus, the two PGA sub-socket components facing each other across the PGA socket 500, namely, sub-socket components 11 and 24, and sub-socket components 16 and 22, actuate with lateral motion in a common absolute direction. Further, the mechanisms for the ZIF actuation in each of the sub-socket components 11, 16, 20, 24 are linked so that they all move substantially simultaneously.

Figure 8:
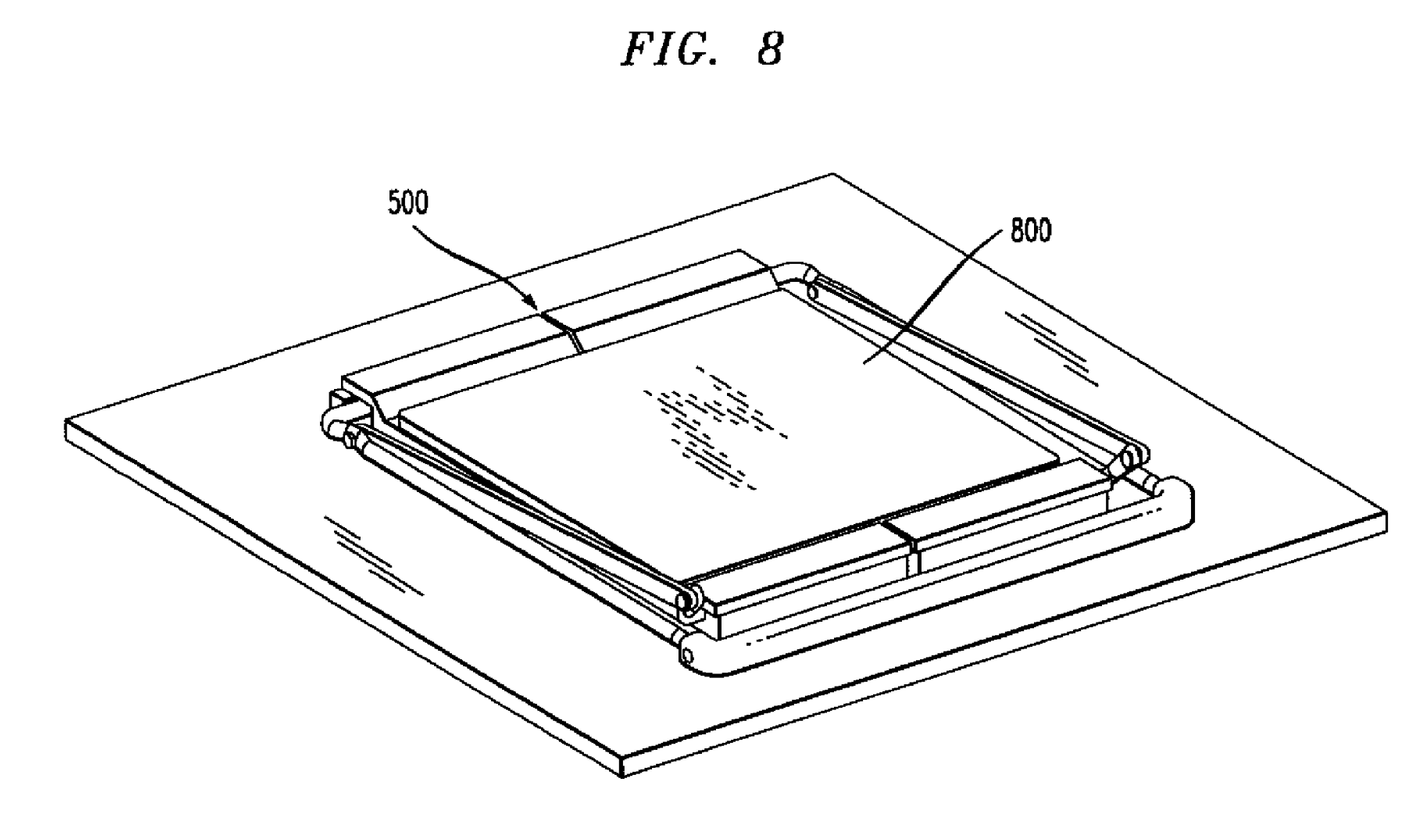
FIG. 8 is a perspective view depicting the exemplary ZIF PGA socket of FIG. 5 fully engaged with an IC module inserted therein, in accordance with an embodiment of the invention.

FIG. 8 is a perspective view depicting the exemplary ZIF PGA socket 500 of FIG. 5 in a fully engaged position with an IC module 800 inserted therein, in accordance with an embodiment of the invention. In the fully engaged position, internal contact members of the PGA socket are in electrical and mechanical contact with the pins of the IC module 800, as previously explained.

Figure 9:
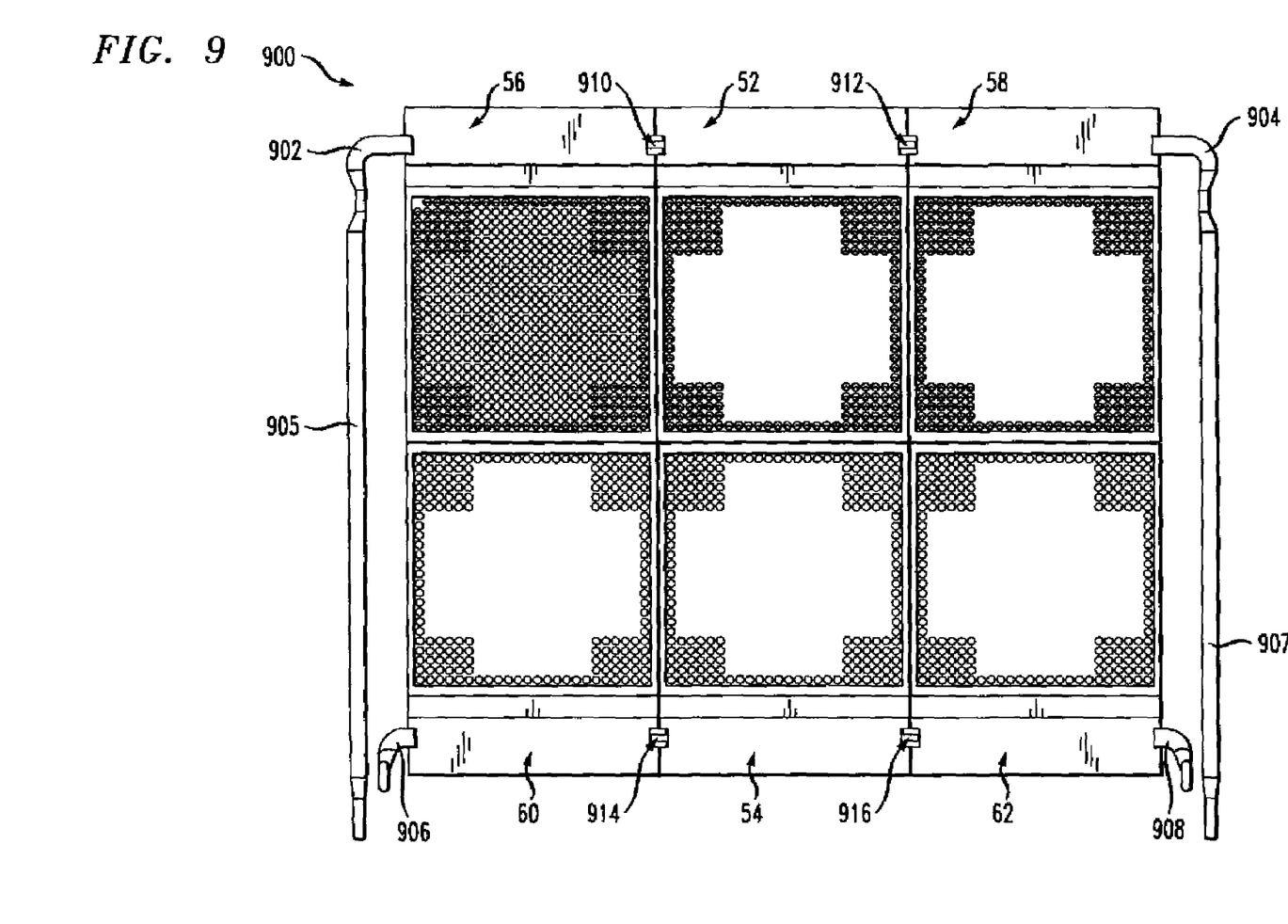
FIG. 9 is a top plan view depicting an exemplary ZIF PGA socket, formed in accordance with another embodiment of the present invention.

FIG. 9 is a top plan view depicting an exemplary ZIF PGA socket 900, formed in accordance with another embodiment of the present invention. The illustrative PGA socket 900 comprises a plurality of PGA sub-socket components, namely, a first sub-socket component 56, a second sub-socket component 52, a third sub-socket component 58, a fourth sub-socket component 62, a fifth sub-socket component 54, and a sixth sub-socket component 60. The plurality of sub-socket components 52, 54, 56, 58, 60, 62 are configured to effectively function together as a larger PGA socket to thereby receive IC modules having a larger pin count compared to the illustrative PGA socket 500 shown in FIG. 5.

Sub-socket components 56, 58, 60 and 62 form outside corners of the larger PGA socket 900 and may therefore be referred to herein as exterior sub-socket components. The exterior sub-socket components 56, 58, 60 and 62 preferably include their own mechanical levers 902, 904, 906 and 908, respectively. Levers 902 and 906 of oppositely facing exterior sub-socket components 56 and 60, respectively, are preferably adapted for connection to a common lever arm 905. Likewise, levers 904 and 908 of oppositely facing exterior sub-socket components 58 and 62, respectively, are preferably adapted for connection to a common lever arm 907. Each of the levers 902, 904, 906, 908 are adapted to activate an internal cam mechanism in the respective sub-socket component which moves a top portion of the sub-socket component so as to electrically and mechanically engage contact members of the sub-socket component with corresponding pins of an IC module received by the sub-socket component, as previously explained.

Alternatively, the cam mechanism in one or more of the sub-socket components may be adapted to move the contact members either instead of or in addition to moving the top portion of the sub-socket component, with objective again being to electrically and mechanically engage contact members of the sub-socket component with corresponding pins of the IC module. For example, the top portion of a given sub-socket component may be stationary and the base of the sub-socket component which includes the contact members, being configured to move laterally relative to the top portion. All of the sub-socket components in the PGA socket 900 are preferably configured such that movement of the respective plurality of contact members is performed in a same plane (e.g., laterally) and in a same direction relative to one another.

As apparent from the figure, sub-socket components 52 and 54 form inside sections of the overall PGA socket 900. As such, these sub-socket components 52, 54, which may be referred to herein as interior sub-socket components, do not include their own actuation levers. Instead, each of the interior sub-socket components 52, 54 includes a slot-key linkage, or alternative linkage arrangement, for mechanically engaging the interior sub-socket component with at least one adjacent sub-socket component which, in the embodiment shown, is an exterior sub-socket component. Specifically, PGA socket 900 includes a first slot-key linkage 910 configured to mechanically couple adjacent sub-socket components 56 and 52, a second slot-key linkage 912 configured to mechanically couple adjacent sub-socket components 58 and 52, a third slot-key linkage 914 configured to mechanically couple adjacent sub-socket components 60 and 54, and a fourth slot-key linkage 916 configured to mechanically couple adjacent sub-socket components 62 and 54. In accordance with other embodiments of the invention, a PGA socket may comprise several interior sub-socket components arranged such that a given interior sub-socket component mechanically engages another interior sub-socket component which is adjacent thereto.

When lever 902 is actuated, rotational motion is transferred through exterior sub-socket component 56 by the cam mechanism therein, through slot-key linkage 910, to actuate the cam mechanism in interior sub-socket component 52. Likewise, when lever 904 is actuated, rotational motion is transferred through exterior sub-socket component 58 by the corresponding cam mechanism therein, through slot-key linkage 912, to actuate the cam mechanism in sub-socket component 52. If additional interior sub-socket components are employed in the PGA socket 900, mechanical linkages between adjacent sub-socket components can similarly function to transfer rotational motion from a lever associated with an exterior sub-socket component to actuate corresponding cam mechanisms in such additional interior sub-socket components.

Figure 10:
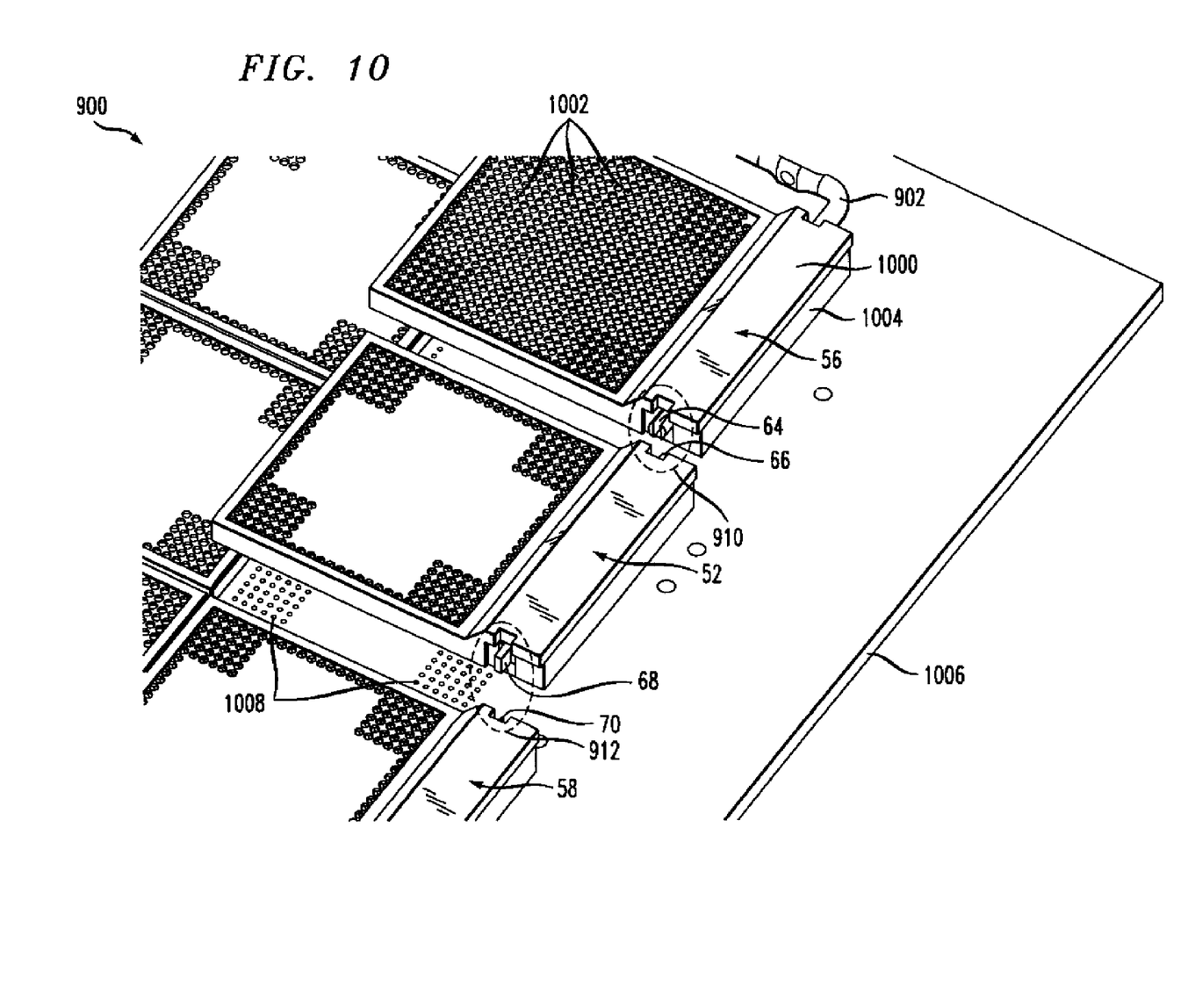
FIG. 10 is an exploded perspective view depicting at least a portion of the exemplary PGA socket shown in FIG. 9, in accordance with an embodiment of the invention.

With reference now to FIG. 10, an exploded perspective view of at least a portion of exemplary PGA socket 900 is shown. Each of the sub-socket components may be formed in a manner similar to the sub-socket components previously described, for example in conjunction with FIG. 5. Specifically, each of the sub-socket components, of which sub-socket component 56 is representative, preferably comprises a top portion 1000 including a plurality of apertures 1002 therein for receiving pins of an IC module, and bottom portion or base 1004. Only a subset of the actual number of apertures are shown in the figure for clarity. The top portion 1000 is preferably adapted to move laterally in relation to the base 1004 via the internal cam mechanism included in the base. The base 1004 further includes a plurality of contact members (not visible in this view), each contact member corresponding to one of the apertures 1002 in the top portion 1000 of the sub-socket component 56. The contact members are preferably configured so as to extend through the base for providing electrical connection to corresponding pad sites 1008 on a printed wiring board 1006 upon which the sub-socket components may be mounted.

As stated above in conjunction with FIG. 9, a slot-key linkage may be employed to transfer rotational movement of the internal cam mechanism of a given exterior sub-socket component (e.g., sub-socket component 56) to an interior sub-socket component (e.g., sub-socket component 52) for activating the cam mechanism of the interior sub-socket component. In order to more clearly illustrate the slot-key linkage, exterior sub-socket component 56 and adjacent interior sub-socket component 52 are illustrated as being raised slightly above printed wiring board 1006 upon which the other four sub-socket components are mounted.

As shown in the figure, exterior sub-socket component 56 is preferably configured having a mechanical lever 902 on one side (left) and a slot-key linkage, which may comprise a "U-shaped" slot 64, on the other side (right). Interior sub-socket component 52 is preferably configured having a slot-key linkage on at least one side, and preferably includes a slot-key linkage on both sides as shown, In order to mechanically engage with corresponding slot 64 in the exterior sub-socket component 56, the slot-key linkage in sub-socket component 52 preferably comprises a key 66. Key 66 may be shaped as a bar configured to fit into a corresponding groove in U-shaped slot 64. It is to be understood that the invention is not limited to the particular slot-key linkage arrangement shown, and that various other linkage configurations are contemplated by the invention for mechanically engaging interior sub-socket components in the PGA socket 900 (e.g., gears, etc.). Interior sub-socket component 52 preferably includes another key 68 on an opposite side of its internal cam mechanism. The key 68 is adapted for mechanically engaging with a slot 70 in an adjacent sub-socket component 58, which in the embodiment shown is an exterior sub-socket component. In this manner, the cam mechanism in sub-socket component 58 can be actuated by lever 902 in sub-socket component 56, with the rotational movement of the cam mechanism in sub-socket component 56 being transferred to sub-socket component 52 via slot 64 and key 66, through sub-socket component 52 by the cam mechanism therein, and transferred to sub-socket component 58 via key 68 and slot 70.

Figure 11:
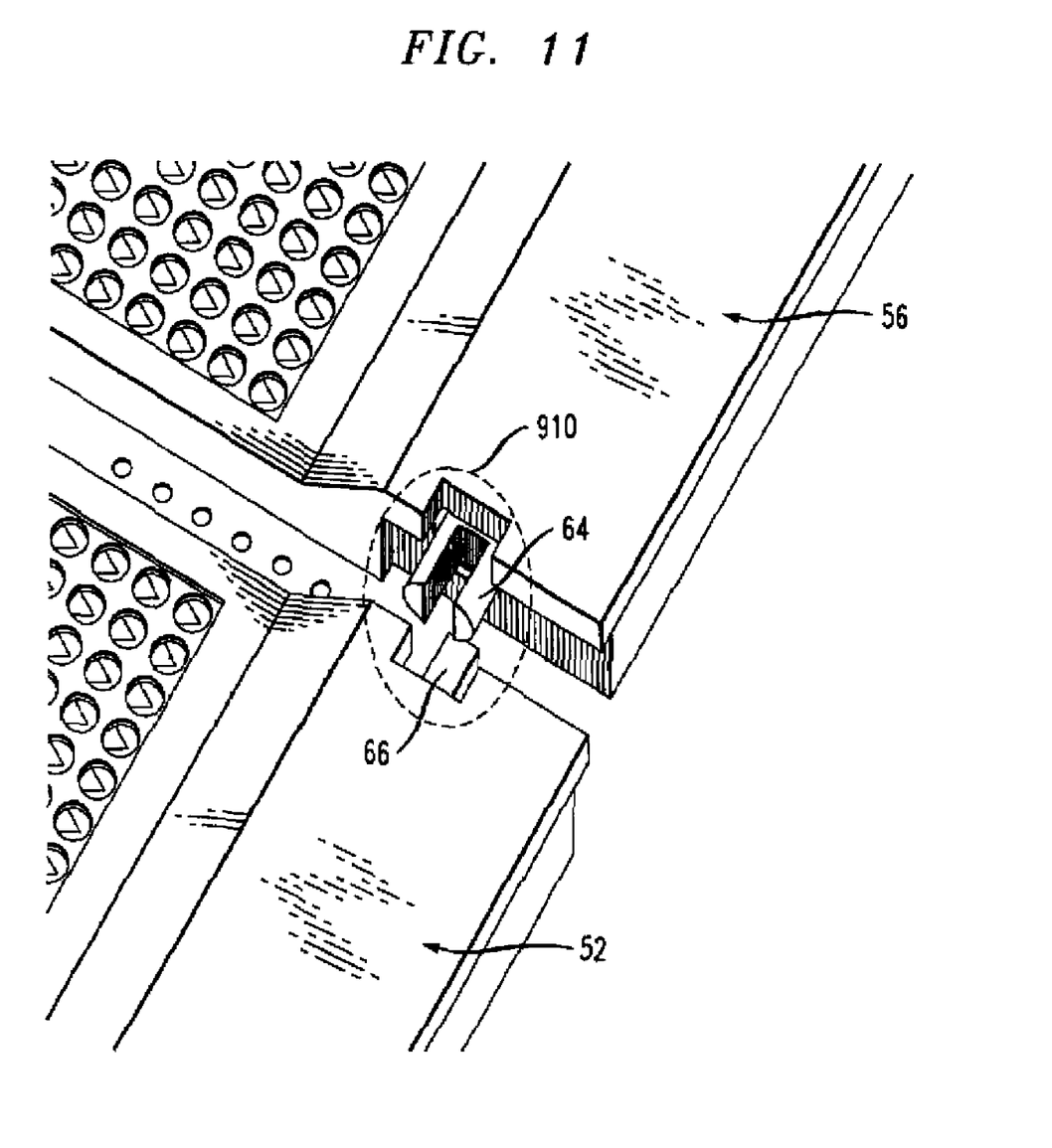
FIG. 11 is an exploded perspective view illustrating an enlargement of a slot-key linkage of the exemplary PGA socket shown in FIG. 9, in accordance with an embodiment of the invention.

FIG. 11 is an enlarged perspective view depicting slot-key linkage 910, comprising slot 64 in sub-socket component 56 and key 66 in sub-socket component 52. As apparent from the figure, bar-shaped key 66 is adapted to fit between the U-shaped slot 64 to provide mechanical coupling between sub-socket components 56 and 52.

Aspects of the present invention describe methodologies for beneficially increasing an area that can be accommodated by combining a plurality of fine pitch PGAs, although modifications in the design, molding and/or mechanism of each constituent sub-socket component may be required. By way of example only, consider an exemplary case where four sub-socket components are combined. First, the direction of travel of a top portion of a given sub-socket component (see, e.g., FIG. 3, top portion 6) relative to an outside edge (e.g., 13 in FIG. 3) of the sub-socket component should be opposite the direction of travel of a top portion of a sub-socket component facing the given sub-socket component across the PGA socket array. Thus, in FIG. 5, for example, the top portion of sub-socket component 24 would need to move in an opposite direction relative to its base compared to sub-socket component 11, so that when they are mechanically actuated by the common lever system they will move substantially simultaneously in the same direction and by the same amount.

In the illustrative embodiments described above, the top portions of each sub-socket component is molded and fabricated as separate pieces. In accordance with another embodiment of the invention, the respective bases of the sub-socket components may be molded and fabricated as separate pieces, while the corresponding top portions are formed as a single large piece. This would be a valuable alternative if the flatness issue during molding remained problematic but the wall thickness issue mentioned above were overcome. Conversely, if the flatness during molding issue was overcome but the wall thickness molding issue remained problematic, then a single bottom piece could be molded and four top portions attached.

In accordance with another aspect of the invention, an exemplary method is provided for holding the plurality of sub-socket components (e.g., four in an illustrative embodiment) together with precise alignment during soldering to the printed wiring board. This exemplary method utilizes a "dummy" module with pins in the identical positions as an actual IC module. The dummy module is inserted into the four sub-socket components forming the overall PGA socket while being held in a jig and the lever system (e.g., comprising levers 502, 504, 22 and 26, lever arms 9 and 18, and primary lever arm 32 shown in FIG. 6) is fully engaged. This fully engaged assembly of dummy module with four sockets is then preferably transferred to the printed wiring board, solder is re-flowed above its melting point (e.g., above about 360 degrees Fahrenheit), and allowed to cool. The lever system is then disengaged and the dummy module removed. The PGA socket is then ready to receive a functional IC module.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A pin grid array socket comprising a plurality of sub-socket components used in combination, each of the plurality of sub-socket components comprising:
   a plurality of apertures configured to receive corresponding pins of an integrated circuit (IC); and
   a plurality of contact members, each of the contact members corresponding to, but not extending into, a respective one of the apertures, the contact members being configured to movably engage with corresponding pins of the IC upon respective movement of the plurality of apertures so as to provide electrical and mechanical contact between the contact members and corresponding pins of the IC;
   wherein each of the sub-socket components in the pin grid array socket is configured to mechanically engage at least one of the other sub-socket components such that the plurality of contact members in each of the sub-socket components are capable of electrically connecting to corresponding pins of the IC substantially simultaneously.

2. The socket of claim 1, wherein each of the sub-socket components has a spacing between adjacent apertures of less than about 1.27 millimeters.

3. The socket of claim 1, wherein each of the sub-socket components is adapted for mounting to a substrate.

4. The socket of claim 1, wherein each of the plurality of sub-socket components comprises:
   a stationary base including the plurality of contact members; and
   a movable top portion disposed on the base and including the plurality of apertures, each aperture corresponding to a given one of the contact members, the top portion being adapted to move laterally relative to the base such that the pins of the IC received by the respective apertures are brought into electrical and mechanical contact with corresponding contact members as the top portion is moved laterally from a first position to a second position, wherein in the first position no electrical contact is provided between the contact members and corresponding pins of the IC, and in the second position electrical contact is provided between the contact members and corresponding pins of the IC.

5. The socket of claim 4, wherein at least a portion of the plurality of contact members are configured to extend downwardly through the base so as to provide an electrical interface between respective pins of an IC received by the socket and corresponding conductors disposed on a printed wiring board.

6. The socket of claim 4, wherein the movable top portions the plurality of sub-socket components are adapted for movement in a same direction and in a same plane relative to one another.

7. The socket of claim 4, further comprising a linkage arm mechanically engaging at least one of the sub-socket components such that the top portions of the plurality of sub-socket components are moved laterally from the first position to the second position upon movement of the linkage arm.

8. The socket of claim 1, wherein each of the plurality of sub-socket components comprises:
   a movable base including the plurality of contact members; and
   a stationary top portion disposed on the base and including the plurality of apertures, each aperture corresponding to a given one of the contact members;
   wherein the base is adapted to move laterally relative to the top portion such that the pins of the IC received by the respective apertures are brought into electrical contact with corresponding contact members as the base is moved laterally from a first position to a second position, wherein in the first position no electrical contact is provided between the contact members and corresponding pins of the IC, and in the second position electrical contact is provided between the contact members and corresponding pins of the IC.

9. The socket of claim 8, wherein at least a portion of the plurality of contact members are configured to extend downwardly through the base so as to provide an electrical interface between respective pins of an IC received by the socket and corresponding conductors disposed on a printed wiring board.

10. The socket of claim 8, wherein the movable bases of the plurality of sub-socket components are adapted for movement in a same direction and in a same plane relative to one another.

11. The socket of claim 8, further comprising a linkage arm mechanically engaging at least one of the sub-socket components such that the movable bases of the plurality of sub-socket components are moved laterally from the first position to the second position upon movement of the linkage arm.

12. The socket of claim 1, further comprising at least one mechanical linkage adapted to mechanically engage a first one of the plurality of sub-socket components with a second one of the plurality of sub-socket components.

13. The socket of claim 12, wherein the at least one mechanical linkage comprises a slot-key linkage.

14. The socket of claim 12, wherein the at least one mechanical linkage comprises a gear linkage.

15. The socket of claim 1, wherein each of the plurality of sub-socket components comprises a cam mechanism adapted to movably engage the respective plurality of contact members with corresponding pins of the IC, a first side of at least a first one of the plurality of sub-socket components comprising a mechanical lever and a second side of the first sub-socket component comprising a mechanical linkage, at least a first side of at least a second one of the plurality of sub-socket components comprising a mechanical linkage configured to form a mechanical coupling with the mechanical linkage of the first sub-socket component, wherein a rotational motion applied to the mechanical lever for actuating the cam mechanism in the first sub-socket component is transferred to the cam mechanism in the second sub-socket component via the mechanical coupling therebetween.

16. The socket of claim 15, wherein the mechanical linkage coupling the first and second sub-socket components comprises a slot-key linkage.

17. A pin grid array sub-socket adapted for use in combination with at least a second pin grid array sub-socket to form a larger pin grid array socket, the pin grid array sub-socket comprising:
   a plurality of apertures configured to receive corresponding pins of an integrated circuit (IC);
   a plurality of contact members, each of the contact members corresponding to, but not extending into, a respective one of the apertures, the contact members being configured to movably engage with corresponding pins of the IC upon respective movement of the plurality of apertures so as to provide electrical and mechanical contact between the contact members and corresponding pins of the IC; and
   a cam mechanism adapted to movably engage the plurality of contact members with corresponding pins of the IC, a first side of the sub-socket comprising a mechanical lever and a second side of the sub-socket comprising a mechanical linkage adapted to mechanically engage a corresponding cam mechanism in the second pin grid array sub-socket, whereby a rotational motion of the mechanical lever for actuating the cam mechanism in the sub-socket is transferred to the cam mechanism in the second sub-socket such that the plurality of contact members in the sub-socket and in the second sub-socket move in the same direction relative to one another and electrically connect to corresponding pins of the IC substantially simultaneously.

18. An apparatus including at least one zero-insertion force pin grid array socket, the pin grid array socket comprised of a plurality of individually manufactured sub-socket components used in combination, each of the plurality of sub-socket components comprising:
   a plurality of apertures configured to receive corresponding pins of an integrated circuit (IC); and
   a plurality of contact members, each of the contact members corresponding to, but not extending into, a respective one of the apertures, the contact members being configured to movably engage with corresponding pins of the IC upon respective movement of the plurality of apertures so as to provide electrical and mechanical contact between the contact members and corresponding pins of the IC;
   wherein each of the sub-socket components in the pin grid array socket is configured to mechanically engage at least one of the other sub-socket components such that the plurality of contact members in each of the sub-socket components are capable of electrically connecting to corresponding pins of the IC substantially simultaneously.

* * * * *